(12) United States Patent
Embler

(10) Patent No.: US 12,242,294 B2
(45) Date of Patent: Mar. 4, 2025

(54) ALTERNATING-CURRENT POWER-SWITCHING DEVICE

(71) Applicant: Google LLC, Mountain View, CA (US)

(72) Inventor: Gary Lee Embler, Redwood, CA (US)

(73) Assignee: Google LLC, Mountain View, CA (US)

( * ) Notice: Subject to any disclaimer, the term of this patent is extended or adjusted under 35 U.S.C. 154(b) by 56 days.

(21) Appl. No.: 18/358,643

(22) Filed: Jul. 25, 2023

(65) Prior Publication Data

US 2024/0040088 A1 Feb. 1, 2024

Related U.S. Application Data

(63) Continuation of application No. PCT/US2022/074371, filed on Aug. 1, 2022.

(51) Int. Cl.
*H04N 7/18* (2006.01)
*G05F 1/56* (2006.01)
*G08B 3/10* (2006.01)

(52) U.S. Cl.
CPC .......... *G05F 1/56* (2013.01); *G08B 3/10* (2013.01); *H04N 7/186* (2013.01)

(58) Field of Classification Search
None
See application file for complete search history.

(56) References Cited

U.S. PATENT DOCUMENTS

| | | | |
|---|---|---|---|
| 9,819,867 B2 * | 11/2017 | Siminoff | G08B 13/196 |
| 10,325,453 B2 * | 6/2019 | Chen | H02J 7/007 |
| 10,559,171 B2 * | 2/2020 | Wu | G08B 3/10 |
| 10,607,458 B1 | 3/2020 | Sampson et al. | |
| 10,638,097 B1 * | 4/2020 | Skeoch | G08B 3/10 |
| 11,348,417 B2 * | 5/2022 | Fan Chiang | H02M 7/217 |
| 11,393,302 B2 * | 7/2022 | Wei | H02M 5/2573 |
| 11,645,894 B2 * | 5/2023 | Warren | H03K 17/122 |
| | | | 327/427 |
| 12,046,127 B2 * | 7/2024 | Chen | G08B 3/10 |
| 2005/0007715 A1 | 1/2005 | Mukai et al. | |

(Continued)

OTHER PUBLICATIONS

"International Search Report and Written Opinion", Application No. PCT/US2022/074371, Mar. 16, 2023, 12 pages.

*Primary Examiner* — Thomas J. Hiltunen
(74) *Attorney, Agent, or Firm* — Colby Nipper PLLC

(57) ABSTRACT

This document describes methods implemented by and systems utilizing an alternating-current (AC) power-switching device. The AC power-switching device includes first and second current input/output (I/O) nodes, a current-limiting resistor, and a bypass switch connected between the first and second current I/O nodes. The bypass switch includes a first light-emitting-diode-input normally closed solid-state relay. Further, the AC power-switching device includes a rectifier, a voltage regulator, and a controller. The controller includes a programmable controller chip and is configured to detect a voltage level at the output of the rectifier, activate the bypass switch in response to the voltage level exceeding a first voltage level threshold, set a first lockout timer in response to activating the bypass switch, and deactivate the bypass switch in response to the voltage level dropping below a second voltage level threshold. Thus, the AC power-switching device is effective at switching power between a first and second apparatus.

20 Claims, 11 Drawing Sheets

(56) References Cited

U.S. PATENT DOCUMENTS

| | | | |
|---|---|---|---|
| 2009/0184773 A1* | 7/2009 | Woo | H03L 7/193 |
| | | | 331/1 R |
| 2017/0272652 A1 | 9/2017 | Siminoff et al. | |
| 2018/0195333 A1 | 7/2018 | Jeon et al. | |
| 2019/0013682 A1* | 1/2019 | Jeon | H02J 7/0068 |
| 2019/0387104 A1 | 12/2019 | Yssa | |
| 2020/0388118 A1 | 12/2020 | Rosenberg et al. | |
| 2021/0175792 A1 | 6/2021 | Kasmir | |
| 2021/0287498 A1* | 9/2021 | Fan Chiang | G08B 3/10 |
| 2022/0237993 A1 | 7/2022 | Warren et al. | |

\* cited by examiner

ALTERNATING-CURRENT POWER-SWITCHING DEVICE

RELATED APPLICATION(S)

This application is a continuation of and claims priority to International Application No. PCT/US2022/074371, filed Aug. 1, 2022, the disclosure of which is incorporated herein by reference in its entirety.

BACKGROUND

Any one of a variety of electronic devices require power, either by an alternating-current (AC) source or a direct-current (DC) source. Some of these devices may be configured to be powered directly by AC mains power at an outlet in a wall of a home, business, or other dwelling. Other devices may be configured to be powered by AC power from a step-down transformer, for example. Yet other devices may be configured to be powered by DC power via an on-board or an off-board AC-to-DC power converter (e.g., a power brick) or a battery. In other words, electronic devices are powered.

In some implementations, mains power, or a derivative thereof (e.g., power from a step-down transformer), does not provide a sufficient amount of power for multiple electronic devices and/or systems simultaneously. In such implementations, however, at least one or more of the multiple electronic devices and/or systems generally include a dedicated power supply, including an on- or off-board AC-to-DC converter, a battery, a generator, and so forth, which results in electronic devices and/or systems that are more complex and more costly.

SUMMARY

This document describes methods implemented by and systems utilizing an alternating-current (AC) power-switching device. The AC power-switching device includes first and second current input/output (I/O) nodes, a current-limiting resistor, and a bypass switch connected between the first and second current I/O nodes. The bypass switch includes a first light-emitting-diode-input (LED-input) normally closed (NC) solid-state relay (SSR). Further, the AC power-switching device includes a rectifier, a voltage regulator, and a controller. The controller includes a programmable controller chip and is configured to detect a voltage level at the output of the rectifier, activate the bypass switch in response to the voltage level exceeding a first voltage level threshold, set a first lockout timer in response to activating the bypass switch, and deactivate the bypass switch in response to the voltage level dropping below a second voltage level threshold. Thus, the AC power-switching device is effective at switching power between a first and second apparatus.

In an aspect, an alternating-current power-switching device is described comprising: first and second current input/output nodes; a current-limiting resistor connected in series with the second current input/output node; a bypass switch connected in series between the current-limiting resistor and the first current input/output node, the bypass switch comprising a first light-emitting-diode-input normally closed solid-state relay; a rectifier connected in parallel with the bypass switch and the current-limiting resistor; a voltage regulator connected to an output of the rectifier; and a controller connected to the output of the rectifier and an output of the voltage regulator, the controller comprising a programmable controller chip, the controller configured to: detect a voltage level at the output of the rectifier; in response to the voltage level exceeding a first voltage level threshold, activate the bypass switch; in response to activating the bypass switch, set a first lockout timer defining a first duration of time, the first lockout timer usable by the controller to deactivate the bypass switch if the voltage level exceeds the first voltage level threshold for longer than the first duration of time defined by the first lockout timer; and deactivate the bypass switch in response to the voltage level dropping below a second voltage level threshold prior to expiration of the first lockout timer, the second voltage level threshold being lower than the first voltage level threshold.

Implementations may include one or more of the following features, or any combination thereof: the current-limiting resistor comprises a first current-limiting resistor connected in parallel with a second current-limiting resistor; the current-limiting resistor comprises a first current-limiting resistor connected in series with a second current-limiting resistor; the bypass switch further comprises a second light-emitting-diode-input normally-closed solid-state relay connected in parallel with the first light-emitting-diode-input normally-closed solid-state relay; the alternating-current power-switching device further comprising a fuse directly connected to the first current input/output node, the bypass switch, and the rectifier; the fuse is configured as one of a positive-temperature-coefficient fuse, a thermal fuse, or a resettable fuse; the first and second current input/output nodes have a voltage in a range of 20 volts to 43 volts; the rectifier is configured as one of a half-wave rectifier, a full-wave rectifier, or a bridge rectifier; the rectifier is configured to output a direct current voltage in a range of 21 volts to 27 volts; the voltage regulator is configured to supply direct current voltage to the bypass switch and the controller; the voltage regulator is configured to output a direct current voltage in a range of 1.5 volts to 2.1 volts; the controller comprises a light-emitting diode configured to provide an input to the bypass switch; the controller drives the light-emitting diode with a logic-level output or an open-drain output; and the controller is further configured to, in response to activating the bypass switch, set a second lockout timer defining a second duration of time shorter than the first duration of time, the second lockout timer usable by the controller to prohibit deactivation of the bypass switch until the second duration of time has expired.

In aspects, an alternating-current (AC) power-switching device is disclosed. The AC power-switching device includes a first current input/output (I/O) node and a second current I/O node. The AC power-switching device further includes a current-limiting resistor connected in series with the second current I/O node. As an example, the current-limiting resistor may be a single resistor, two or more resistors in parallel, two or more resistors in series, or any combination thereof. Additionally, the AC power-switching device includes a bypass switch connected in series between the current-limiting resistor and the first current I/O node. The bypass switch may include one or more light-emitting-diode-input (LED-input) NC solid-state relays (SSRs). Further, the device includes a rectifier connected in parallel with the bypass switch and the current-limiting resistor. The rectifier may be a half-wave rectifier, a full-wave rectifier, a bridge rectifier, and the like. The AC power-switching device also includes a voltage regulator connected to an output of the rectifier. In addition, the AC power-switching device includes a controller, which includes a programmable controller chip, and is connected to the output of the rectifier and an output of the voltage regulator. The programmable controller chip may be any appropriate programmable controller chip including, for example, a field-programmable gate array (FPGA).

In additional aspects, the controller is configured to detect a voltage level at the output of the rectifier. Responsive to the voltage level at the output of the rectifier exceeding a first voltage level threshold, the controller activates (e.g., opens) the bypass switch. Responsive to activating the bypass switch, the controller sets a first lockout timer defining a first duration of time. The first lockout timer is usable by the controller to deactivate the bypass switch if the voltage level at the output of the rectifier exceeds the first voltage level threshold for longer than the first duration of time defined by the first lockout timer. Additionally, responsive to the voltage level at the output of the rectifier dropping below a second voltage level threshold, which is lower than the first voltage level threshold, and prior to the expiration of the first lockout timer, the controller deactivates (e.g., closes) the bypass switch.

In further aspects, a system is disclosed. The system includes a video-recording doorbell, a doorbell chime electrically connected to the video-recording doorbell, a transformer connected to the doorbell chime and the video-recording doorbell, and the AC power-switching device described herein. The doorbell chime is configured to generate an audio signal in response to activation of a button on the video-recording doorbell. The audio signal may be generated electronically (e.g., by a speaker) or mechanically (e.g., by a mechanical device striking a bell), for example. The transformer is configured to provide AC power to the video-recording doorbell and the AC power-switching device is connected to the video-recording doorbell and the doorbell chime. The AC power-switching device is configured to control power provided to the chime.

The details of one or more implementations are set forth in the accompanying Drawings and the following Detailed Description. Other features and advantages will be apparent from the Detailed Description, the Drawings, and the Claims. This Summary is provided to introduce subject matter that is further described in the Detailed Description.

BRIEF DESCRIPTION OF THE DRAWINGS

The details of one or more aspects of an alternating-current power-switching device are described in this document with reference to the following Drawings, in which the use of same numbers in different instances may indicate similar features or components.

DETAILED DESCRIPTION

Overview

In implementations where a power source is not capable of providing power for multiple electronic devices in a system simultaneously, at least one or more of the multiple electronic devices may include a dedicated power supply. The dedicated power supply can include on- or off-board AC-to-DC converters, batteries, generators, DC-to-DC converters, and so forth. Accordingly, these electronic devices and/or systems are more complex, thus less reliable, and more costly.

However, in other implementations, one or more of the electronic devices may include a power-switching device. The power switching device can be made of discrete components (e.g., resistors, capacitors, inductors), programmable chips (e.g., field-programmable gate arrays (FPGAs)), logic gates (e.g., OR gates, AND gates), and so forth. In many cases, these components may be less complex, thus more reliable, and less costly than a dedicated power supply. In these implementations, the electronic devices having the power-switching device may be included in an existing system by switching power between devices and/or systems at appropriate times.

Increased complexity, reduced reliability, and higher cost are just three examples of how including a dedicated power supply with an electronic device may not be preferred. This document describes methods implemented by and systems utilizing an AC power-switching device, thus avoiding increased complexity, reduced reliability, and higher cost. The following discussion describes operating environments, techniques that may be employed in the operating environments, example methods, and example devices. Although systems and techniques implemented by an AC power-switching device are described, it is to be understood that the subject of the appended claims is not necessarily limited to the specific features or methods described. Rather, the specific features and methods are described as example implementations, and reference is made to the operating environment by way of example only.

Example Device

Figure 1A:
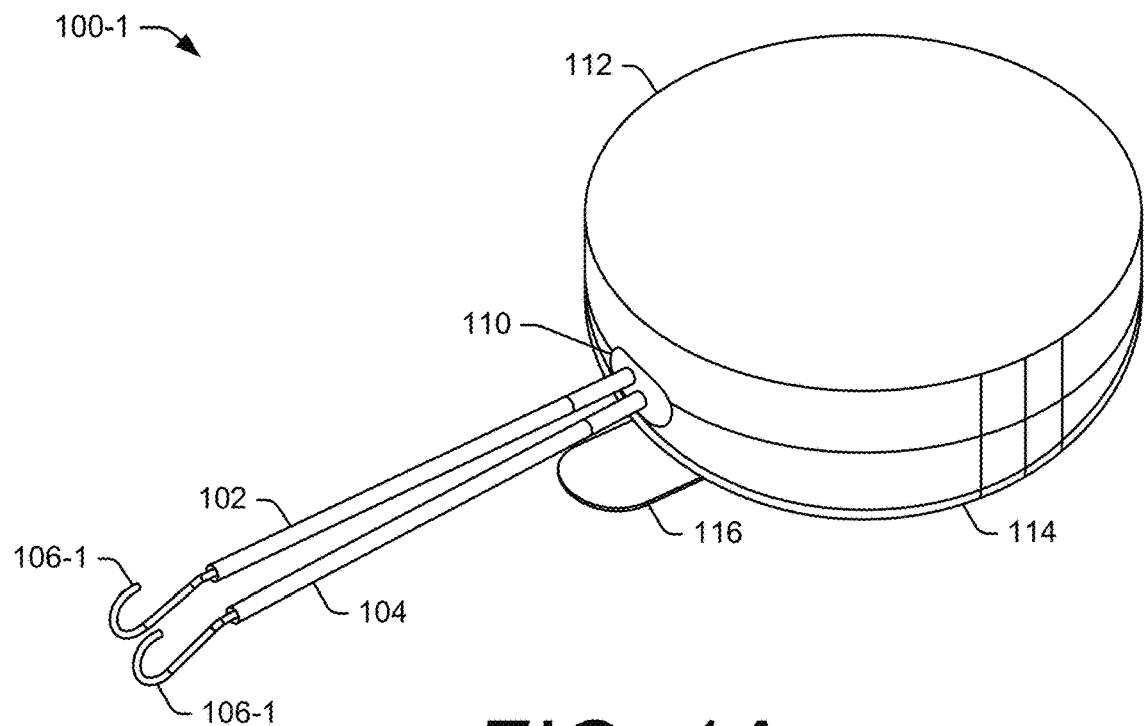
FIG. 1A illustrates a right front perspective view of an example implementation of an AC power-switching device having hooked terminals.

FIG. 1A illustrates a right front perspective view of an example implementation 100-1 of an AC power-switching device having hooked terminals. The AC power-switching device includes a first current input/output (I/O) node 102 and a second current I/O node 104. The first current I/O node 102 and the second current I/O node 104 are electrically conductive cables (e.g., a group or bundle of wires inside a common sheathing). The wires can be solid wires or stranded wires of any one of a variety of gauges (e.g., diameters) and electrically conductive materials (e.g., copper, aluminum). The cables can include two or more insulated phase line wires, an insulated or bare ground wire, a bare neutral wire, or any combination thereof. The sheathing is an electrically insulating material and can include any one of a variety of insulating materials, including thermoplastic, heat-resistant plastic, flame-retardant synthetic polymer, oil- and gasoline-resistant nylon, or the like. FIG. 1A also illustrates that the first current I/O node 102 and the second current I/O node 104 include hook-shaped terminals 106-1 on one end and enter a housing on an opposite end through an opening 110. The housing includes a top cover 112, a bottom cover 114, and a mounting adhesive 116 disposed as a bottom layer beneath the bottom cover 114. The mounting adhesive 116 can be any one of a variety of adhesives, including wet adhesive, contact adhesive, reactive adhesive, pressure-sensitive adhesive (PSA), or the like.

Figure 1B:
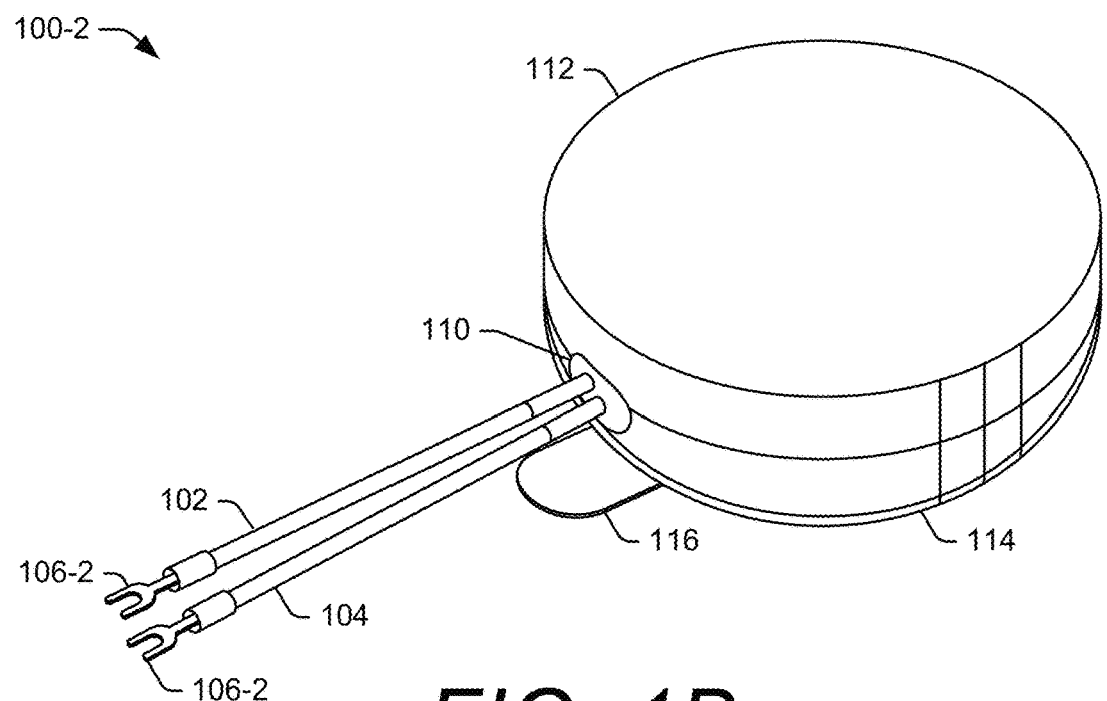
FIG. 1B illustrates a right front perspective view of an example implementation of an AC power-switching device having Y-shaped terminals.

FIG. 1B illustrates a right front perspective view of an example implementation 100-2 of an AC power-switching device having Y-shaped terminals. In the example implementation 100-2, the first current I/O node 102 and the second current I/O node 104 include Y-shaped terminals 106-2 on one end and enter the housing on an opposite end through the opening 110. Although two types of terminals (e.g., hook-shaped terminals 106-1, Y-shaped terminals 106-2) are described herein, the terminals can be any shape or size appropriate to make an electrically conductive connection to an AC power source. FIG. 1B further illustrates the top cover 112, the bottom cover 114, and the mounting adhesive 116.

Figure 2:
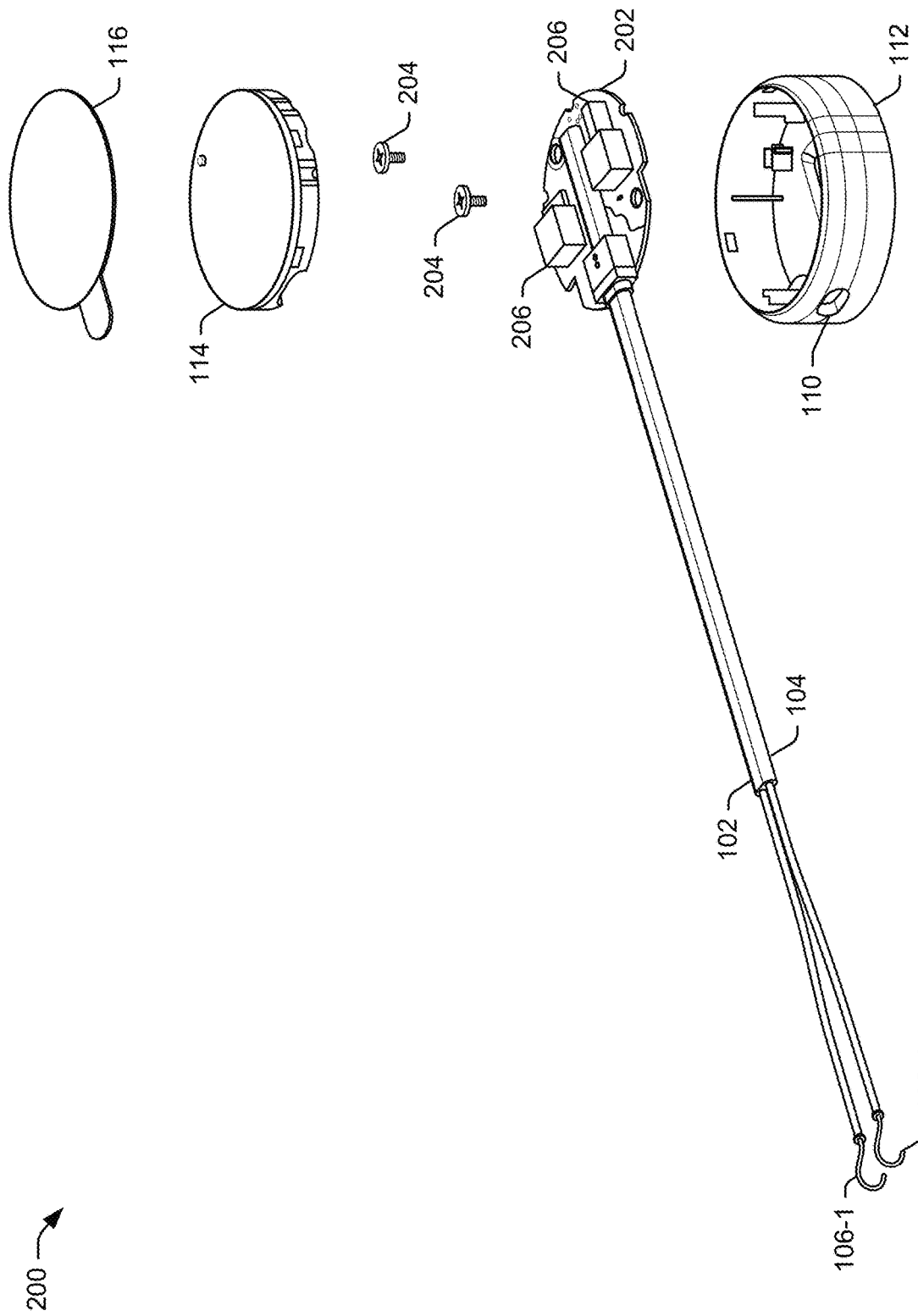
FIG. 2 illustrates an exploded view from a left rear perspective of the AC power-switching device from FIG. 1A having the hooked terminals.

FIG. 2 illustrates an exploded view from a left rear perspective of an example implementation 200 of the AC power-switching device from FIG. 1A having the hooked terminals. As illustrated, the AC power-switching device includes the first current I/O node 102, the second current I/O node 104, the hook-shaped terminals 106-1 on the one end of the current I/O nodes 102 and 104, the opening 110 in the top cover 112, the bottom cover 114, and the mounting adhesive 116. FIG. 2 further illustrates that the housing of the AC power-switching device encloses a printed circuit board 202 (PCB 202). Also illustrated in FIG. 2 are PCB screws 204 configured to secure the PCB 202 to the top cover 112. Although PCB screws 204 are described herein, any appropriate mounting mechanism may be used to secure the PCB 202 to the top cover 112, including adhesives, press-fit interfaces, friction interfaces, and so forth. FIG. 2 further illustrates various PCB components 206, which may be electrically connected (e.g., by solder) to the PCB 202. The PCB components 206 can include programmable chips (e.g., field-programmable gate arrays (FPGAs)), fuses (e.g., resettable fuses, positive-temperature-coefficient (PTC) fuses), capacitors, inductors, resistors, diodes, light-emitting diodes (LEDs), relays, SSRs, switches, and so forth.

Figure 3:
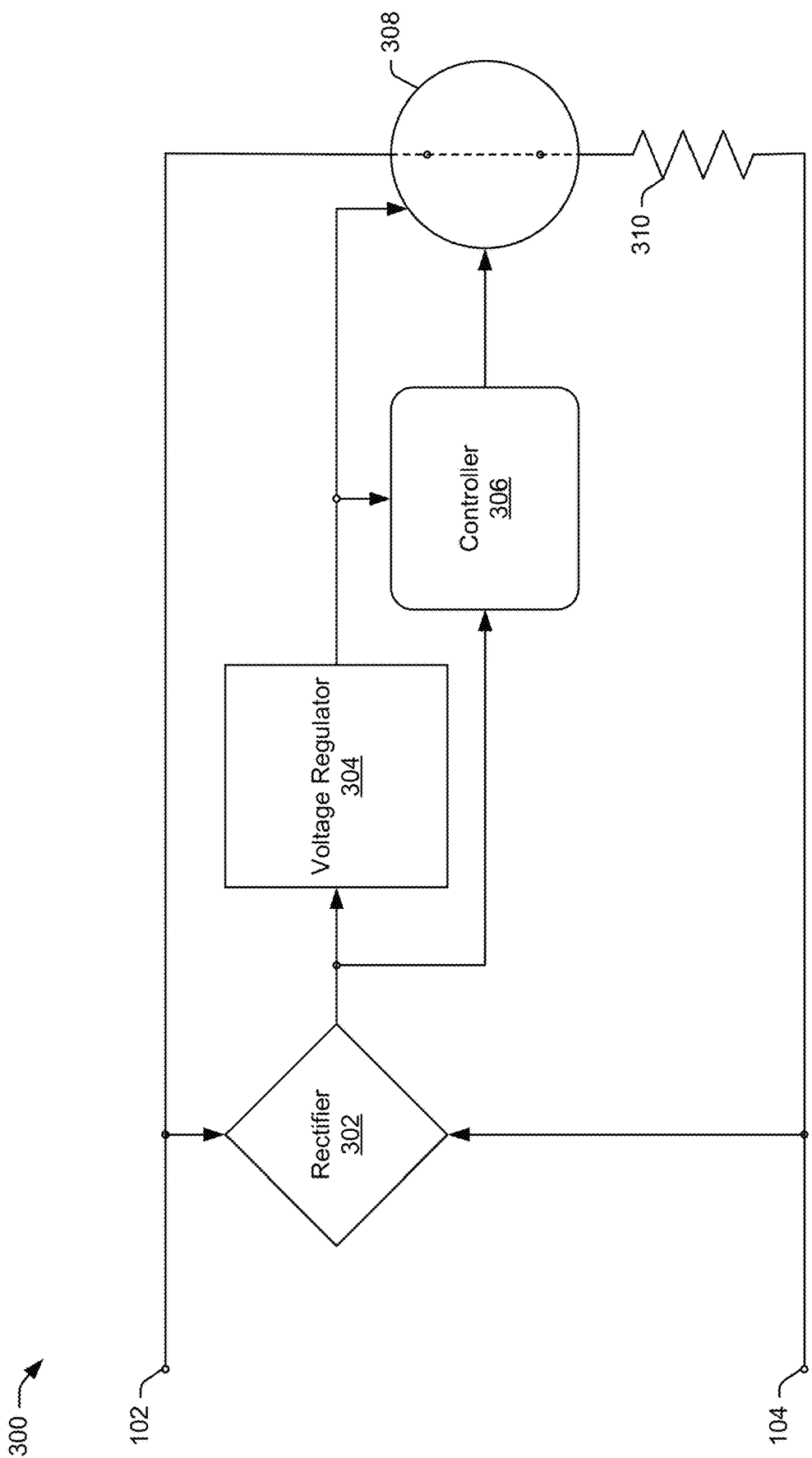
FIG. 3 illustrates a circuit block diagram of an example implementation of the AC power-switching device.

FIG. 3 illustrates a circuit block diagram of an example implementation 300 of the AC power-switching device from FIG. 2. As illustrated, the circuit block diagram includes the first current I/O node 102 and the second current I/O node 104. The first and second current I/O nodes 102 and 104 may receive AC power in a voltage range of 20 volts (V) to 43 V, for example. Also as illustrated, the circuit block diagram includes a rectifier 302, a voltage regulator 304, a controller 306, a bypass switch 308, and a current-limiting resistor 310. The current-limiting resistor 310 is connected in series between the second current I/O node 104 and the bypass switch 308. Though a single resistor is illustrated, the current-limiting resistor 310 can be any configuration of one or more resistors appropriate to limit a current through the bypass switch. For example, the current-limiting resistor 310 can be a single resistor, as illustrated, or two or more resistors in parallel, two or more resistors in series, or any combination thereof.

The bypass switch 308 is connected in series between the current-limiting resistor 310 and the first current I/O node 102. Even though a single bypass switch is illustrated, the bypass switch 308 may be a combination of one or more bypass switches, configured in series, in parallel, or any combination thereof. Furthermore, the bypass switch 308 can be a relay, an SSR, a mechanical switch, a magnetic switch, and so forth, in an NC configuration. The rectifier 302 is connected in parallel with the bypass switch 308 and the current-limiting resistor 310 between the first and second current I/O nodes 102 and 104. The rectifier 302 may be any one of a variety of rectifiers, including half-wave rectifiers and full-wave rectifiers (e.g., bridge rectifiers), configured to convert AC power at two inputs to direct-current (DC) power at an output. Although not shown, the rectifier 302 may also include any one or more of various damping components appropriate to reduce a noise in the DC power at the output. The damping components may include any one or more of capacitors, inductors, and resistors configured in series, in parallel, or any combination thereof.

Connected to the output of the rectifier 302 are the voltage regulator 304 and the controller 306. The voltage regulator 304 may be any one of a variety of voltage regulators, including linear regulators and switching regulators, configured to regulate a DC voltage at an input (e.g., 21 V, 24 V, 27 V) to a DC voltage at an output different than the DC voltage at the input (e.g., 1.5 V, 1.8 V, 2.1 V). The controller 306 may be realized as an integrated circuit (IC), a stand-alone PCB, a PCB incorporating one or more ICs, multiple PCBs, multiple ICs, or any combination thereof. The controller 306 and components thereof are configured to operate using the DC voltage provided by the voltage regulator 304. At least one of the components of the controller includes a programmable controller chip, but additional components may include discrete components (e.g., capacitors, inductors, resistors) or additional chips (e.g., latches, logic gates, registers).

Figure 4:
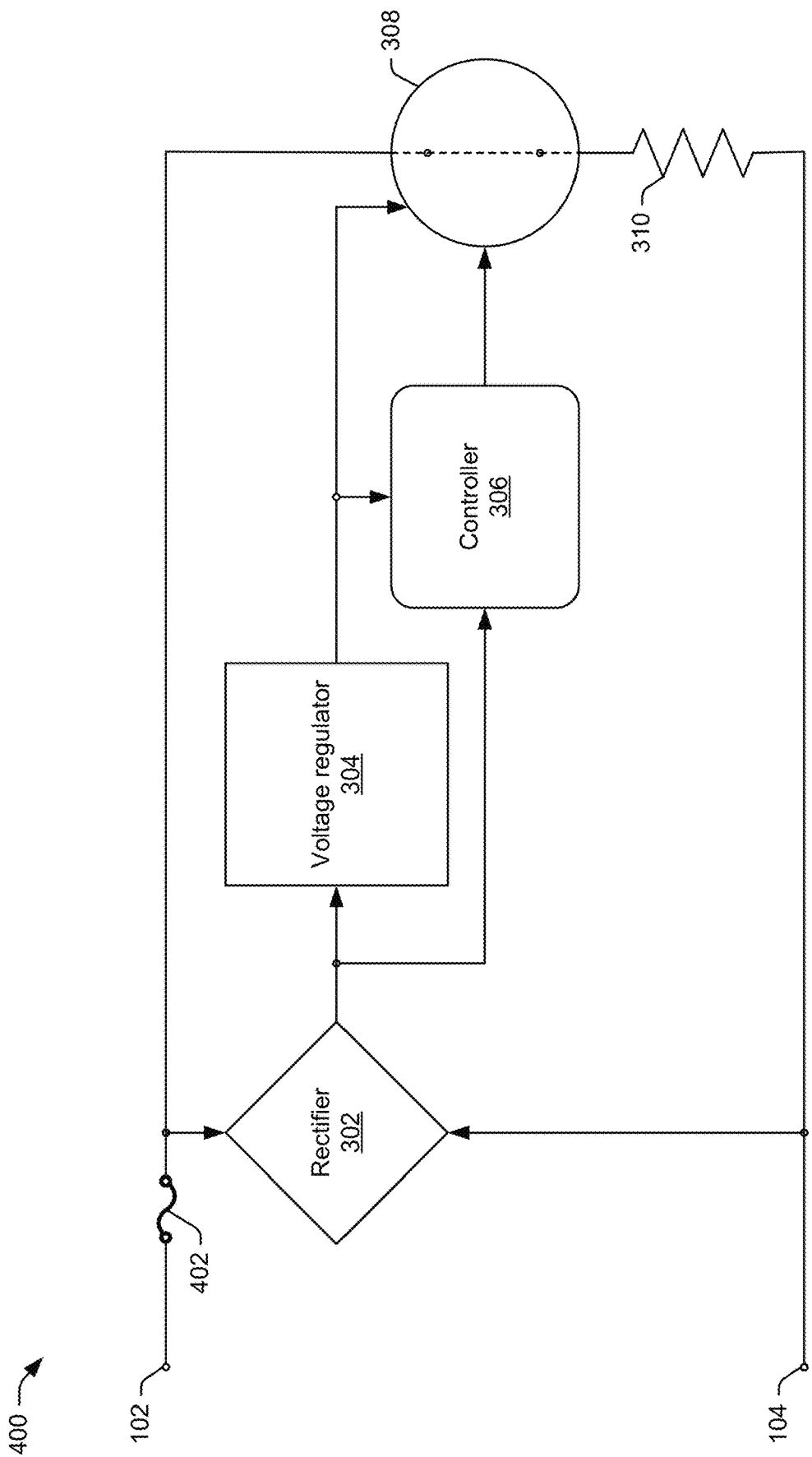
FIG. 4 illustrates a circuit block diagram of an example implementation of the AC power-switching device from FIG. 3 having a fuse.

FIG. 4 illustrates a circuit block diagram of an example implementation 400 of the AC power-switching device from FIG. 3 having a fuse. As illustrated, the AC power-switching device includes the first current I/O node 102, the second current I/O node 104, the rectifier 302, the voltage regulator 304, the controller 306, the bypass switch 308, and the current-limiting resistor 310 described with reference to FIG. 3. Further included in this implementation of the AC power-switching device is a fuse 402 directly connected to the first current I/O node 102, the bypass switch 308, and the rectifier 302. The fuse 402 may be any one of a variety of fuses, including AC fuses, DC fuses, resettable fuses, PTC fuses, cartridge fuses, surface mount fuses, and so forth. The fuse 402 is configured to protect the AC power-switching device and components thereof from an over-current event, such as an electrostatic discharge (ESD) event or a power surge event.

Figure 5:
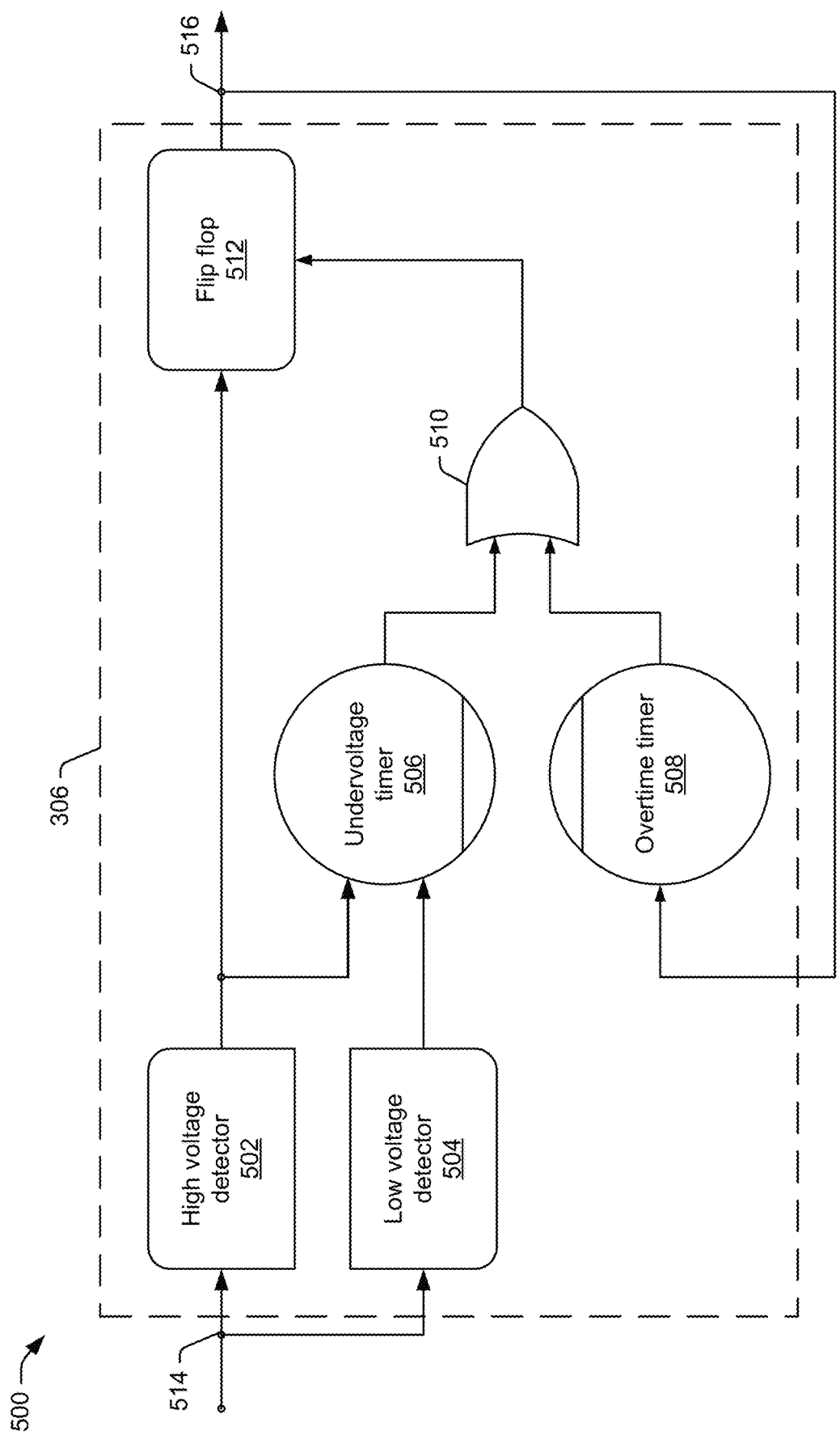
FIG. 5 illustrates an application block diagram of an example implementation of the controller from FIGS. 3 and 4.

FIG. 5 illustrates an application block diagram of an example implementation 500 of the controller 306 from FIGS. 3 and 4. As illustrated, the controller 306 includes a high voltage detector 502, a low voltage detector 504, an undervoltage timer 506, an overtime timer 508, an OR gate 510, and a flip flop 512 (e.g., DQ latch). The high voltage detector 502 and the low voltage detector 504 are each connected to an input of the controller 306 at node 514. The undervoltage timer 506 is connected to outputs of the high voltage detector 502 and the low voltage detector 504. The flip flop 512 is also connected to the output of the high voltage detector 502. The overtime timer 508 is connected to an output of the flip flop 512 at node 516. Outputs of the undervoltage timer 506 and the overtime timer 508 are input to the OR gate 510 and an output of the OR gate 510 is connected to the flip flop 512. In implementations and described in the Example Method section below, node 514 is connected to the output of the rectifier 302 from FIGS. 3 and 4 and node 516 is connected to an input of the bypass switch 308 from FIGS. 3 and 4.

Example Method

Figure 6:
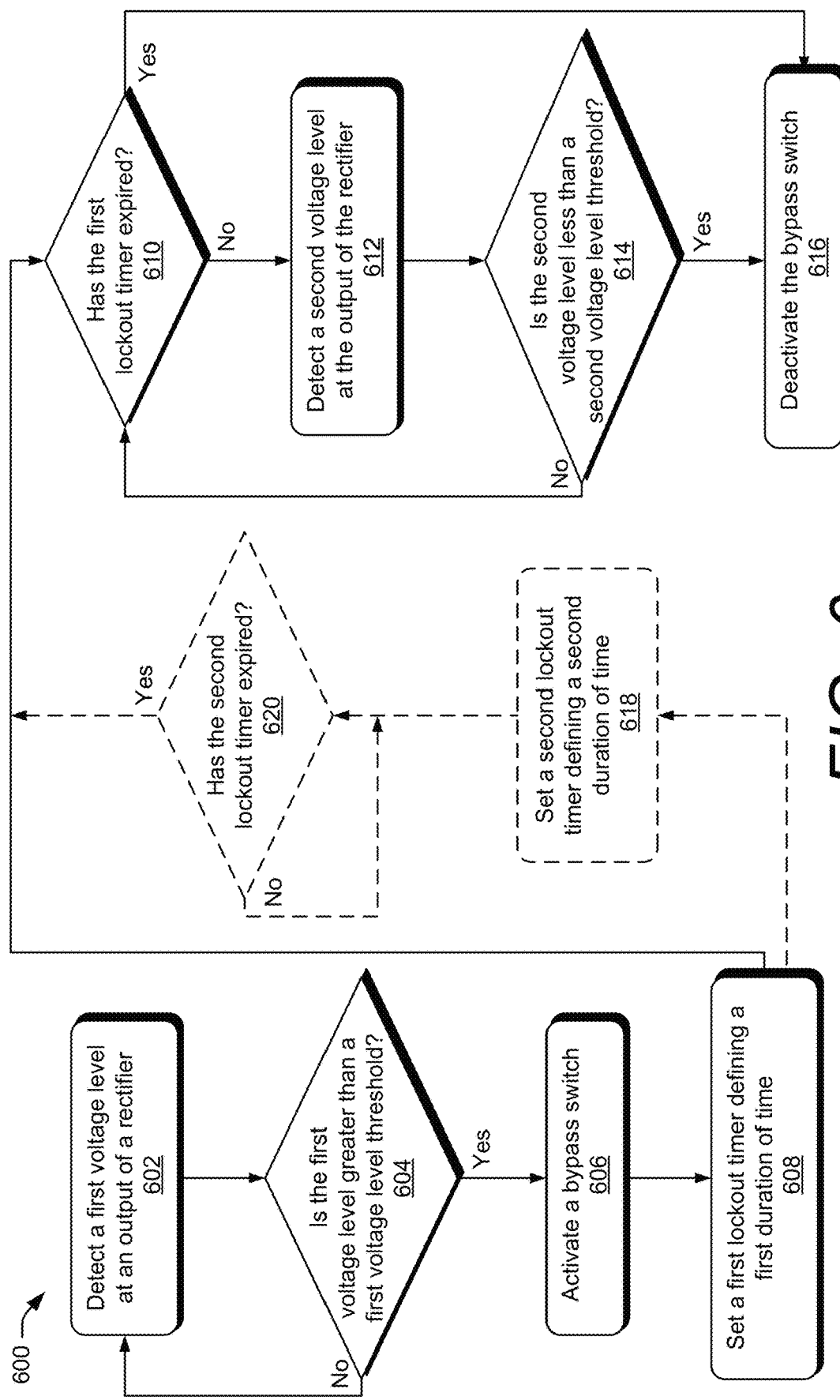
FIG. 6 depicts an example method that the controller from FIGS. 3 and 4 may implement.

FIG. 6 depicts an example method 600 that the controller 306 from FIGS. 3 and 4 is configured to implement. The method 600 is shown as a set of blocks that specify operations performed. The method is not necessarily limited to the order or combinations of the set of blocks shown for performing the operations by the respective blocks. Furthermore, any one or more of the operations may be repeated, combined, reorganized, or linked to provide additional or alternate methods. In portions of the following discussion, reference may be made to the example implementations and entities detailed in FIGS. 1 through 5, reference to which is made for example only. The operations are not limited to performance by one entity or multiple entities operating on one controller. Rather, in some implementations, the operations may be performed by entities operating on multiple controllers.

At 602, a controller (e.g., controller 306) detects a first voltage level at an output of a rectifier (e.g., rectifier 302). For example, the high voltage detector 502 or the low voltage detector 504 detects the first voltage level at the output of the rectifier 302. The rectifier may be any appropriate rectifier configured to convert an AC signal at an input to a DC signal at an output. As some examples, the rectifier may be configured as a half-wave rectifier or a full-wave rectifier (e.g., bridge rectifier). The rectifier may include any one or more appropriate damping components (e.g., capacitors, inductors, resistors) to reduce noise in the DC signal at the output. The first voltage level at the output of the rectifier may be various discrete voltage levels (e.g., 5 V, 8 V, 10 V, 12 V, 15 V) or voltage level ranges (e.g., 21 V to 27 V).

At 604, the controller determines if the first voltage level is greater than a first voltage level threshold. If the first voltage level is not greater than the first voltage level threshold, then the controller continues to monitor the first voltage level by returning to 602. Otherwise, if the first voltage level is greater than the first voltage level threshold, the controller proceeds to 606.

At 606, responsive to the first voltage level at the output of the rectifier exceeding the first voltage level threshold (e.g., 0.4 V, 0.5 V), the controller activates a bypass switch (e.g., bypass switch 308). The bypass switch can be any appropriate switch, including a relay, an SSR, a mechanical switch, a magnetic switch, and so forth. Further, the bypass switch can be any combination of one or more of appropriate switches configured in series, in parallel, or any combination thereof. The bypass switch may be configured as an NC or a normally open (NO) switch, depending on a specific application of the AC power-switching device having the bypass switch.

At 608, responsive to the activation (e.g., opening if NC, closing if NO) of the bypass switch, the controller sets a first lockout timer (e.g., overtime timer 508 of FIG. 5) defining a first duration of time. The first lockout timer may be used by the controller to deactivate the bypass switch if the first voltage level at the output of the rectifier exceeds the first voltage level threshold for longer than the first duration of time defined by the first lockout timer. This condition may occur during an operation cycle due to an unintended error (e.g., a short, a software bug) or an intentional, extended user input.

At 610, the controller determines if the first lockout timer has expired. If the first lockout timer has expired, the controller proceeds to 616. Otherwise, if the first lockout timer has not expired, the controller proceeds to 612.

At 612, the controller detects a second voltage level at the output of the rectifier. For example, the high voltage detector 502 or the low voltage detector 504 detects the second voltage level at the output of the rectifier 302. The second voltage level at the output of the rectifier may be various discrete voltage levels (e.g., 3.0 V, 6.6 V, 8.2 V, 10.5 V, 13.1 V) or voltage level ranges (e.g., 19 V to 25 V).

At 614, the controller determines if the second voltage level is less than a second voltage level threshold, which is lower than the first voltage level threshold (e.g., 0.2 V, 0.3 V). If the second voltage level is not less than the second voltage level threshold, then the controller returns to 610. Otherwise, if the second voltage level is less than the second voltage level threshold, the controller proceeds to 616.

At 616, responsive either to the second voltage level dropping below the second voltage level threshold or the expiration of the first lockout timer, the controller deactivates the bypass switch. For example, if the bypass switch is NC, the controller closes the bypass switch. If the bypass switch is NO, however, the controller opens the bypass switch.

Optionally, at 618, the controller may set a second lockout timer (e.g., undervoltage timer 506 of FIG. 5) defining a second duration of time shorter than the first duration of time (e.g., seconds (s), 0.25 s). The second lockout timer may be used by the controller to prohibit deactivation of the bypass switch, in the event that the first voltage level drops to a voltage level that would typically end the operation cycle, until the second duration of time has expired. Thus, the second lockout timer enables stabilization of the voltage at the output of the rectifier, preventing the controller from terminating an operation cycle too early. At 620, the controller determines if the second lockout timer has expired. If the second lockout timer has expired, the controller proceeds to 610. Otherwise, if the second lockout timer has not expired, the controller returns to 620. In other words, the controller does not proceed until the second lockout timer has expired. The AC power-switching device having the controller configured to implement the method described herein may be utilized in various applications or systems, an example system of which is described in the Example System section below.

Example System

Figure 7A:
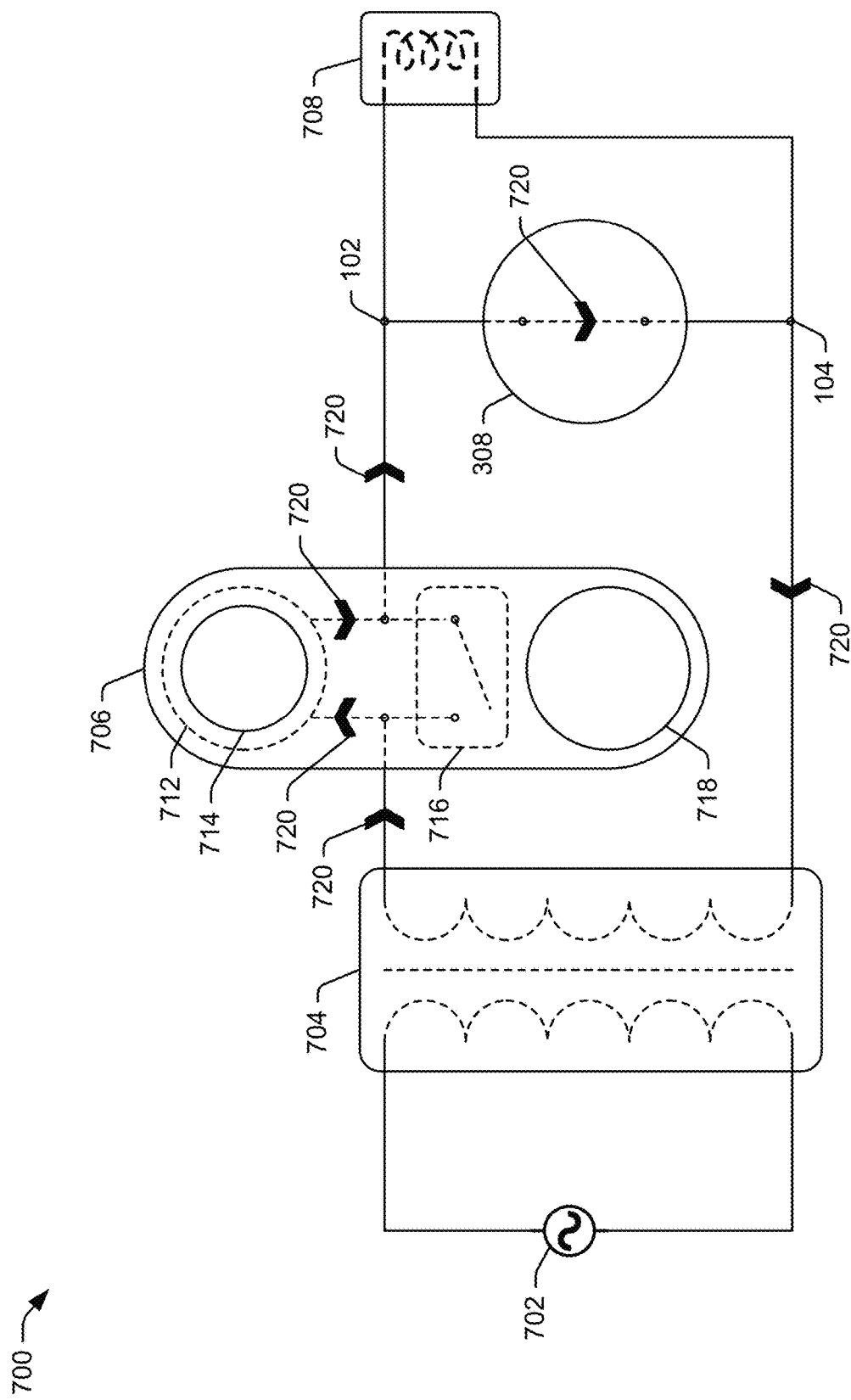
FIG. 7A illustrates an example implementation of a video doorbell system utilizing the AC power-switching device in an idle state.

FIG. 7A illustrates an example implementation 700 of a video doorbell system utilizing the AC power-switching device in an idle state. As illustrated, the system includes the first current I/O node 102, the second current I/O node 104, an AC power source 702 (e.g., mains power), a transformer 704, a video doorbell 706, a chime 708, and an AC power-switching device, of which only the bypass switch 308 is shown for brevity or clarity. The transformer 704, the video doorbell 706, and the chime 708 are connected in series. The bypass switch 308 is connected in parallel with the chime 708. The transformer may be a step-down transformer configured to convert mains power (e.g., 120 VAC) to a lower voltage (e.g., 24 VAC), for example. The video doorbell includes doorbell circuitry 712, a camera 714, a doorbell bypass switch 716, a doorbell button 718, and a battery (not shown). In implementations, the doorbell bypass switch 716 may be an NO switch or an NC switch. However, in this implementation, the doorbell bypass switch 716 is an NO switch, as illustrated. The chime 708 may be a mechanical chime (e.g., solenoid-powered bell) or an electrical chime (e.g., speaker).

In the idle state, the doorbell bypass switch 716 is open and the bypass switch 308 of the AC power-switching device is closed. Because the doorbell bypass switch 716 is open in the idle state, current 720 from the transformer 704 flows to the video doorbell 706, powering the doorbell circuitry 712. The doorbell circuitry 712 may include memory, processors, storage media, sensors (e.g., motion sensors, microphones), speakers, transmitters, receivers, and the like. The doorbell circuitry 712 may be configured to sense motion, record video, transmit video data to a remote computing device (e.g., smartphone), receive audio data to be emitted by a speaker, and so forth. The current 720 continues to flow beyond the video doorbell 706 to the bypass switch 308 via the first current I/O node 102. Because the bypass switch 308 is closed, the current 720 flows through the bypass switch 308, circumventing the chime 708, and back to the transformer 704 via the second current I/O node 104. In this example, the transformer 704 cannot provide sufficient current to power the video doorbell 706 and the chime 708 simultaneously. Accordingly, the AC power-switching device, having the bypass switch 308, enables switching the current between the video doorbell 706 and the chime 708 to provide power to only one of the video doorbell 706 or the chime 708 at a time.

Figure 7B:
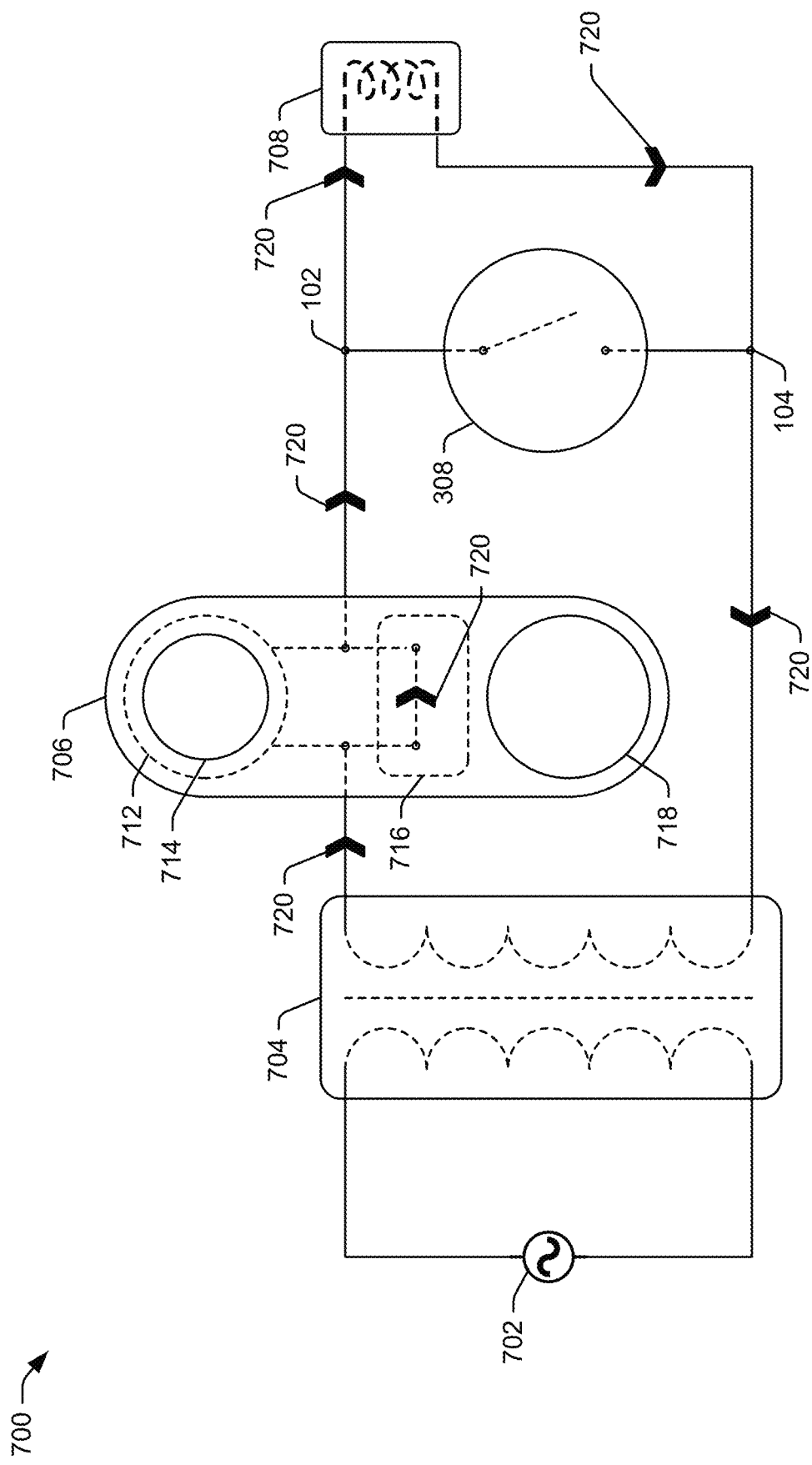
FIG. 7B illustrates the example implementation of the video doorbell system from FIG. 7A in an active state.

FIG. 7B illustrates the example implementation 700 of the video doorbell system from FIG. 7A in an active state. In the active state, the video doorbell bypass switch 716 is closed and the bypass switch 308 is open. Because the doorbell bypass switch 716 is closed, the current 720 circumvents the video doorbell 706. Further, because the bypass switch 308 is open, the current 720 flows to and powers the chime 708 via the first current I/O node 102. While the current 720 circumvents the video doorbell 706, the battery (not shown) powers the doorbell circuitry 712. The current 720 continues to flow beyond the chime 708 and back to the transformer 704 via the second current I/O node 104.

Figure 8:
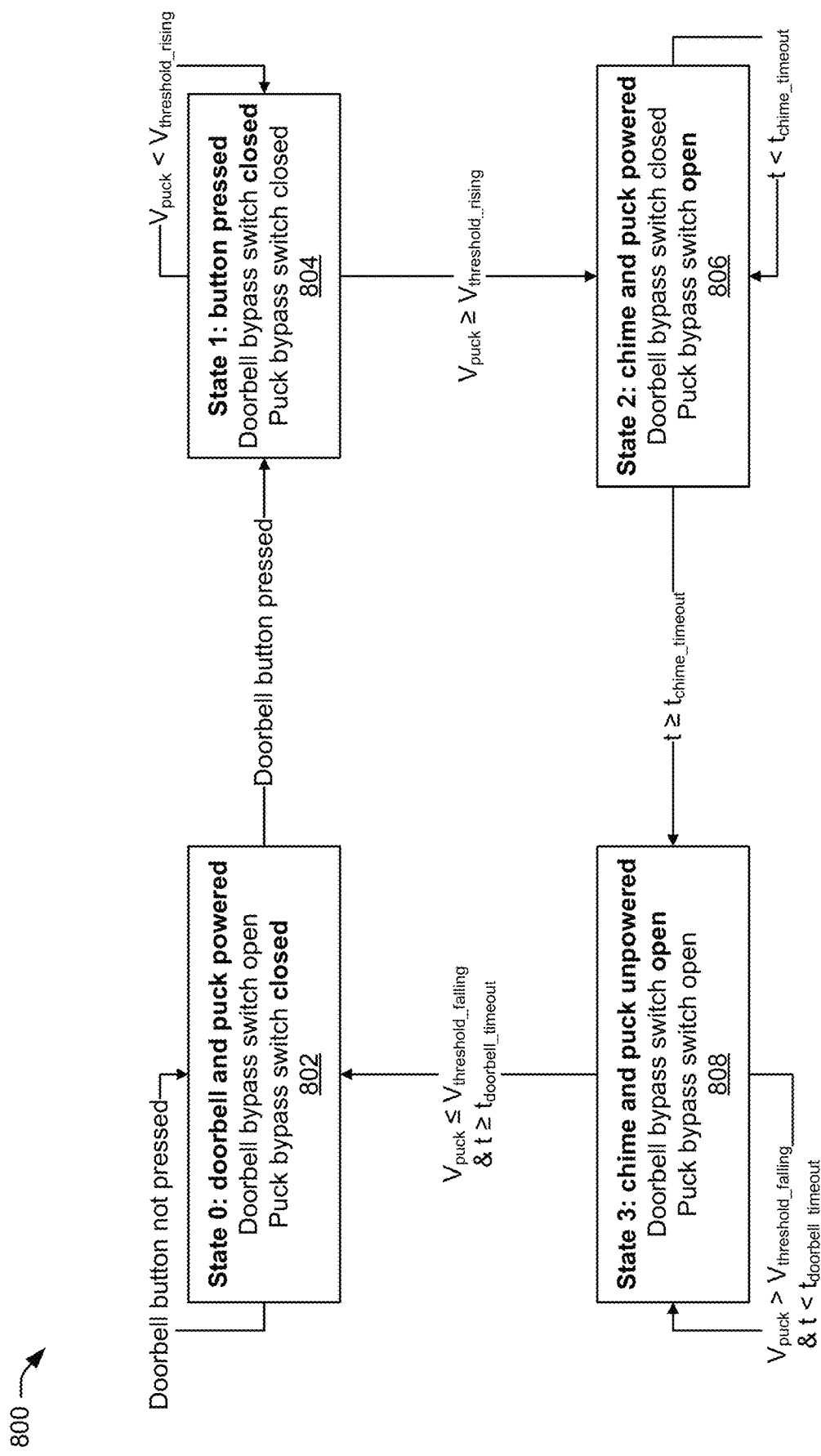
FIG. 8 depicts an example state diagram for the controller from FIGS. 3 and 4.

FIG. 8 depicts an example state diagram 800 for the controller from FIGS. 3 and 4. The state diagram 800 further details states and state transitions of the video doorbell system from FIGS. 7A and 7B, where emphasized words (e.g., in bold font) indicate a change of state from a previous state. In some implementations, the AC power-switching device has a shape resembling a hockey puck (e.g., in FIGS. 1A, 1B, and 2) and is referred to herein as a "puck." The term $V_{puck}$ is the voltage level output by the rectifier 302 and detected by the puck (e.g., by high voltage detector 502 of FIG. 5, by low voltage detector 504 of FIG. 5). The term $V_{threshold\_rising}$ is the first voltage level threshold described in method 600 of FIG. 6. The term $V_{threshold\_falling}$ is the second voltage level threshold described in method 600 of FIG. 6. The term t is a duration of time (e.g., 30 milliseconds (ms), 50 ms, 1 s, 3 s, 10 s) that is initiated when the doorbell button 718 is pressed. The term $t_{chime\_timeout}$ is a user-selectable (e.g., via an application) duration of time appropriate for the chime 708 to complete a chime event. The term $t_{doorbell\_timeout}$ is a predetermined (e.g., by the video doorbell manufacturer) duration of time appropriate for the puck to stabilize during state transitions.

At 802, in state 0, the transformer 704 powers only the video doorbell 706 and not the puck. To accomplish this, the doorbell bypass switch 716 is open and the puck bypass switch 308, connected in parallel with the chime 708, is closed. Therefore, the puck bypass switch 308 bypasses the chime 708 to direct all power to the video doorbell 706. The video doorbell system remains in state 0 while the doorbell button 718 is not pressed. The video doorbell system transitions from state to state 1 when the doorbell button 718 is pressed (e.g., by a user).

At 804, in state 1, when the doorbell button 718 is pressed, the puck bypass switch 308 remains closed, the doorbell bypass switch 716, connected across the video doorbell 706 AC power input, closes, and the puck begins tracking t. The closing of the doorbell bypass switch 716 bypasses the video doorbell 706 and directs all power from the transformer 704 to the chime 708. While the doorbell bypass switch 716 is closed, bypassing the video doorbell 706, a battery in the video doorbell 706 may temporarily supply power to the video doorbell 706. At the beginning of the doorbell button 718 press, both the puck bypass switch 308 and the doorbell bypass switch 716 are closed. To prevent this condition from creating a short-circuit on the output of the transformer 704, the current-limiting resistor 310 connected in series between the puck and the second current I/O node 104 limits the maximum current. Further, the closing of the doorbell bypass switch 716 causes $V_{puck}$ to increase, which the puck detects (e.g., by high voltage detector 502 of FIG. 5). While $V_{puck}$ is less than $V_{threshold\_rising}$, the video doorbell system remains in state 1. When the puck detects that $V_{puck}$ is greater than or equal to $V_{threshold\_rising}$, the video doorbell system transitions from state 1 to state 2.

At 806, in state 2, responsive to $V_{puck}$ equaling or exceeding $V_{threshold\_rising}$, the doorbell bypass switch 716 remains closed and the puck bypass switch 308 is opened. With the doorbell bypass switch 716 closed and the puck bypass switch 308 open, all power provided by the transformer 704 is directed to the chime 708 to cause the chime 708 to initiate a chime event by sounding (e.g., providing an audio signal). While t is less than t timeout, the video doorbell system remains in state 2. The duration of $t_{chime\_timeout}$ may be a programmable length of time selected by a user of the video doorbell system. For example, the user may select (e.g., via an application) an appropriate duration of time necessary for the chime event, from 0.3 s to 10 s, during an initial setup process of the video doorbell system. While t is less than $t_{chime\_timeout}$, the video doorbell system remains in state 2. When the puck determines that t is greater than or equal to t timeout, the video doorbell system transitions from state 2 to state 3.

At 808, in state 3, the puck bypass switch 308 remains open and the doorbell bypass switch 716 opens. The opening of the doorbell bypass switch 716 cuts off power to the chime 708 and causes $V_{puck}$ to decrease, which the puck detects (e.g., by low voltage detector 504 of FIG. 5). While $V_{puck}$ is greater than $V_{threshold\_falling}$ and t is less than $t_{doorbell\_timeout}$, the video doorbell system remains in state 3. In implementations, $t_{doorbell\_timeout}$ is a duration of time (e.g., 0.5 s, 1 s) appropriate for the puck to stabilize after the puck bypass switch 308 closes. When t is greater than or equal to $t_{doorbell\_timeout}$ and the puck detects that $V_{puck}$ is less than or equal to $V_{threshold\_falling}$, the video doorbell system transitions from state 3 back to state 0, where the doorbell bypass switch 716 remains open and the puck bypass switch 308 closes.

Figure 9A:
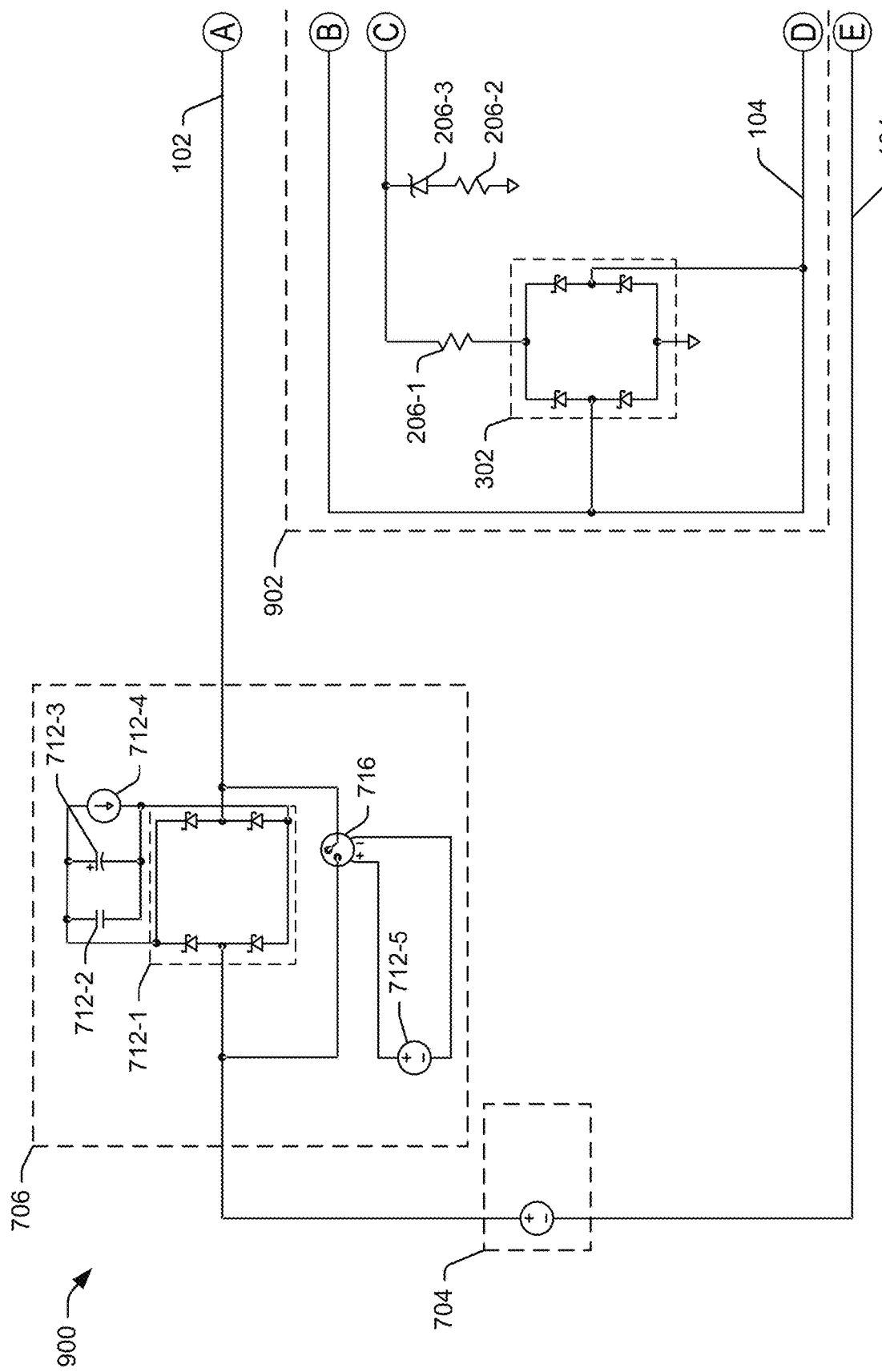
FIG. 9A illustrates a portion of an example circuit of a video doorbell system utilizing the AC power-switching device from FIGS. 1A and 1B.
Figure 9B:
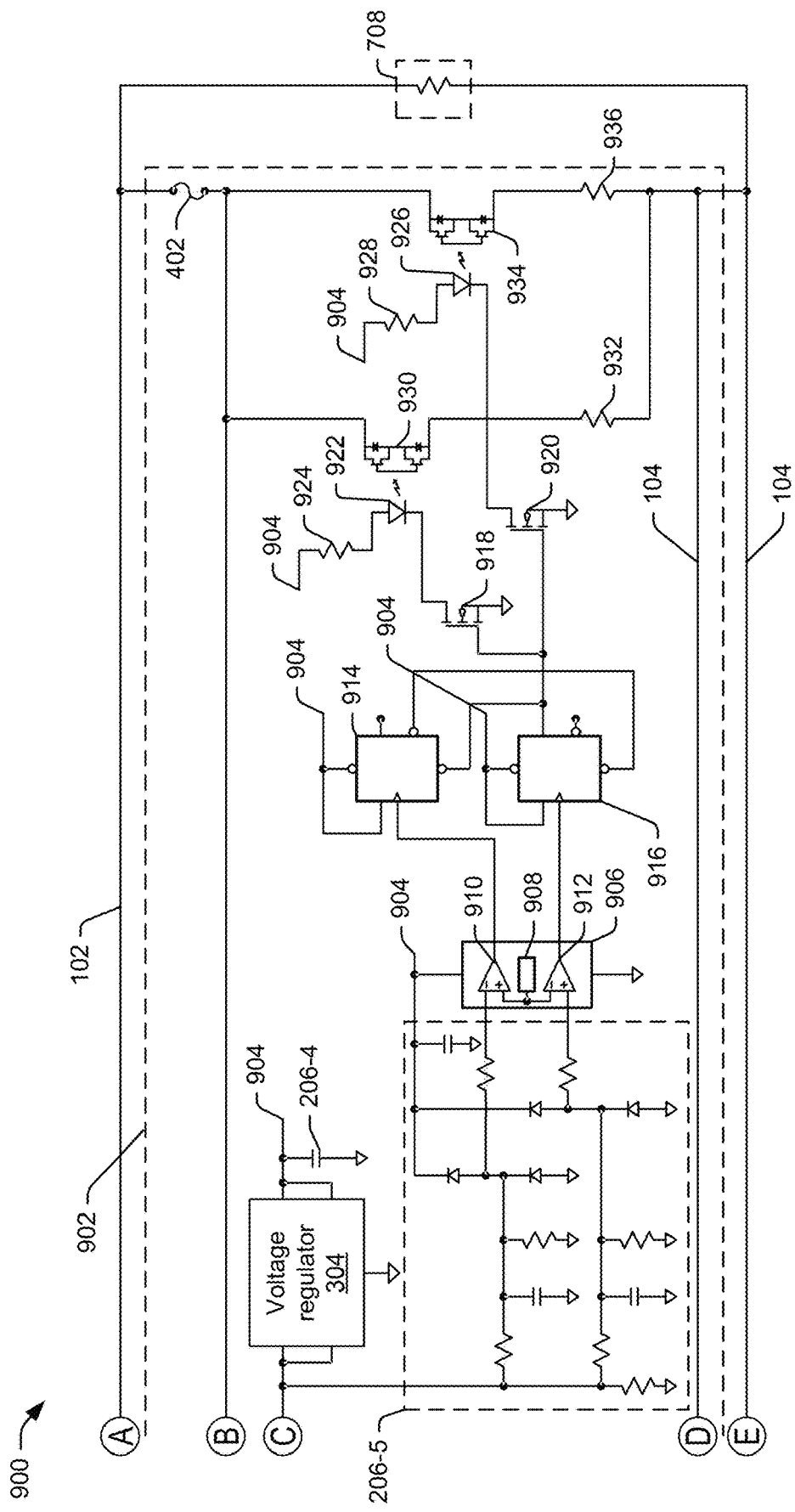
FIG. 9B illustrates another portion of the example circuit of the video doorbell system from FIG. 9A.

FIGS. 9A and 9B illustrate an example circuit 900 of the video doorbell system from FIGS. 7A, 7B, and 8. Some components are omitted from FIGS. 9A and 9B for the sake of clarity.

FIG. 9A illustrates a portion of an example circuit 900 of a video doorbell system utilizing the AC power-switching device from FIGS. 1A and 1B. As illustrated, the example circuit 900 includes the transformer 704, the video doorbell 706, and a portion of an AC power-switching device 902 (puck 902). In this implementation, the transformer 704 is illustrated as a simple voltage supply, which may supply AC voltage in a range of 21 V to 27 V. The video doorbell 706 includes various components of the doorbell circuitry 712 and the doorbell bypass switch 716. In this implementation, the doorbell circuitry 712 includes four diodes configured as a bridge rectifier 712-1, a capacitor 712-2, a polarized capacitor 712-3, a doorbell load 712-4, and a voltage supply 712-5. The bridge rectifier 712-1 may be configured to rectify an AC power input to a DC power output in a voltage range of 21 V to 27 V. The capacitor 712-2 and the polarized capacitor 712-3 may be configured to damp a noise present in the DC power output by the rectifier 712-1, providing a cleaner power input to the doorbell load 712-4. The voltage supply 712-5 controls an operation (e.g., opening, closing) of the doorbell bypass switch. The voltage supply 712-5 may be configured as a button (e.g., doorbell button 718).

Also illustrated in FIG. 9A are the first current I/O node 102 (node A), the second current I/O node 104 (nodes D and E), and additional nodes B and C. The linking between nodes is made clear in FIG. 9B, which is described later. Some components of the puck 902 are illustrated, including the rectifier 302 and various discrete components, which may be included in the PCB components 206 from FIG. 2. In this implementation, the rectifier 302 comprises four diodes configured as a bridge rectifier. The rectifier 302 may rectify an AC power input to a DC power output in a voltage range of 21 V to 27 V. A first resistor 206-1 of the PCB components 206 may be a first current-limiting resistor configured to limit the DC current entering a node C. The second resistor 206-2 of the PCB components 206 may be a second current-limiting resistor configured to limit the amount of current entering (e.g., from node C) a diode 206-3 (e.g., Zener diode). The diode 206-3 of the PCB components 206 may be configured with a voltage (e.g., Zener voltage) of 27 V to V, for example, to protect components connected to node C from an over-current event (e.g., power surge, static shock).

FIG. 9B illustrates another portion of the example circuit 900 of the video doorbell system from FIG. 9A. As illustrated, the example circuit 900 includes another portion of the puck 902 and the chime 708, shown as a simple resistor. FIG. 9B also illustrates the first current I/O node 102 (node A), the second current I/O node (nodes D and E), and nodes B and C from FIG. 9A, in which the linkage between nodes are A-A, B-B, C-C, D-D, and E-E. In this implementation, the puck 902 includes the fuse 402 from FIG. 4, which may be configured as any one of a variety of fuses to protect the puck 902 from an over-current event. The puck 902 includes the voltage regulator 304 from FIG. 3, which may be configured to convert an input DC voltage at node C to an output DC voltage at node 904. The input DC voltage at node C may be in a voltage range of 21 V to 27 V and the output DC voltage at node 904 may be in a range of 1.5 V to 2.1 V. Node 904 at the output of the voltage regulator 304 includes a capacitor 206-4, which may reduce a noise in the output DC voltage. For the sake of clarity, or brevity, various other components 206-5 are not described in an individual capacity. As illustrated, the components 206-5 are illustrated as resistors, capacitors, and diodes, but can include other components not shown. The components 206-5 may be configured to limit currents, protect from ESD events, damp noise, divide voltage, and so forth. Some of the components 206-5 are powered by the DC voltage output by the voltage regulator 304 at node 904.

FIG. 9B further illustrates a differential comparator 906, including a shared reference voltage 908, a first comparator 910, and a second comparator 912. The first and second comparators 910 and 912 may be realized as operational amplifiers having a hysteresis at their inputs. For example, the hysteresis may be a voltage value (e.g., 0.05 V, 0.1 V) defined by a difference between the first (e.g., $V_{threshold\_rising}$) and second (e.g., $V_{threshold\_falling}$) voltage level thresholds described in method 600 of FIG. 6. The hysteresis is effective to limit an undesirable rapid change in the outputs of the differential comparator 906 due to noise at the inputs. As illustrated, the differential comparator 906 is powered by the DC voltage output by the voltage regulator 304 at node 904. The outputs of the differential comparator 906 are connected to a first flip-flop (FF) 914 (FF 914) clock input and a second FF 916 clock input. The DC voltage output by the voltage regulator 304 at node 904 powers the FFs 914 and 916, as well as connects to their data inputs (Ds). As illustrated, an output (Q) of the first FF 914 is left floating while an inverted output (Q') is connected to a reset input of the second FF 916. Further, Q' of the second FF 916 is left floating while Q is connected to a first field-effect transistor 918 (FET 918) and a second FET 920.

The first and second FETs 918 and 920 may be any appropriate FET, including complementary metal-oxide semiconductor (CMOS) FETs, which can be N-doped, P-doped, or any combination thereof. In this implementation, the first and second FETs 918 and 920 are N-doped CMOS FETs, the sources of each connected to ground. The drain of the first FET 918 is connected in series to a first LED 922, a first resistor 924, and the DC voltage output by the voltage regulator 304 at node 904. The drain of the second FET 920 is connected in series to a second LED 926, a second resistor 928, and the DC voltage output by the voltage regulator 304 at node 904. While the gate of the first FET 918 is low, the first FET 918 is not conducting a drain-to-source current because the drain is effectively floating. In other words, the first and second FETs 918 and 920 configured as illustrated are open-drain outputs used to drive the first and second LEDs 922 and 926, respectively. Although an open-drain output configuration is shown, the output may be configured as any appropriate output, including a logic-level output where a source of a P-doped FET is connected to a high logic voltage (e.g., the DC voltage at node 904, 1.8 V), a drain of the P-doped FET is connected to a drain of an N-doped FET, and a source of the N-doped FET is connected to ground. In this configuration, depending on a gate voltage shared by the N-doped and P-doped FETs, the drains can swing from ground to the high logic voltage rather than toggle between ground and floating.

The first and second resistors 924 and 928 may be configured to limit a current through or reduce an input voltage of the first and second LEDs 922 and 926, respectively. Connected (e.g., optically) to an output of the first LED 922 is a first SSR 930. Similarly, a second SSR 934 is connected to an output of the second LED 926. The first SSR 930 is connected in series with a first current-limiting resistor 932 between nodes C and D. The second SSR 934 is connected in series with a second current-limiting resistor 936 between nodes C and D. In this implementation, the first and second SSRs 930 and 934, and the first and second current-limiting resistors 932 and 936 behave as the doorbell bypass switch 308 and the current-limiting resistor 310, respectively, as described with reference to FIGS. 3 and 4.

Collectively, the hysteresis at the inputs of the differential comparator 906 and the state sequence of the first and second FFs 914 and 916 can isolate the first and second SSRs 930 and 934 (e.g., bypass switch 308) from transient voltage ripples, dips, or rises (e.g., noise). By so doing, the puck 902 can operate normally through such disturbances. Any one or more of the components (e.g., first and second LEDs 922 and 926) described with reference to FIGS. 9A and 9B may be implemented as discrete components, or as components of a controller (e.g., controller 306) included in the puck 902.

Additional Examples

In the following section, additional examples are provided.

Example 1

An alternating-current power-switching device comprising: first and second current input/output nodes; a current-limiting resistor connected in series with the second current input/output node; a bypass switch connected in series between the current-limiting resistor and the first current input/output node, the bypass switch comprising a first light-emitting-diode-input normally-closed solid-state relay; a rectifier connected in parallel with the bypass switch and the current-limiting resistor; a voltage regulator connected to an output of the rectifier; and a controller connected to the output of the rectifier and an output of the voltage regulator, the controller comprising a programmable controller chip, the controller configured to: detect a voltage level at the output of the rectifier; in response to the voltage level exceeding a first voltage level threshold, activate the bypass switch; in response to activating the bypass switch, set a first lockout timer defining a first duration of time, the first lockout timer usable by the controller to deactivate the bypass switch if the voltage level exceeds the first voltage level threshold for longer than the first duration of time defined by the first lockout timer; and deactivate the bypass switch in response to the voltage level dropping below a second voltage level threshold prior to expiration of the first lockout timer, the second voltage level threshold being lower than the first voltage level threshold.

Example 2

The alternating-current power-switching device of example 1, wherein the first and second current input/output nodes have a voltage in a range of 20 volts to 43 volts.

Example 3

The alternating-current power-switching device of example 1, wherein the current-limiting resistor comprises a first current-limiting resistor connected in parallel with a second current-limiting resistor.

Example 4

The alternating-current power-switching device of example 1, wherein the current-limiting resistor comprises a first current-limiting resistor connected in series with a second current-limiting resistor.

Example 5

The alternating-current power-switching device of example 1, wherein the bypass switch further comprises a second light-emitting-diode-input normally-closed solid-state relay connected in parallel with the first light-emitting-diode-input normally-closed solid-state relay.

Example 6

The alternating-current power-switching device of example 1, further comprising a fuse directly connected to the first current input/output node, the bypass switch, and the rectifier.

Example 7

The alternating-current power-switching device of example 6, wherein the fuse is configured as a positive-temperature-coefficient fuse.

Example 8

The alternating-current power-switching device of example 6, wherein the fuse is configured as a thermal fuse.

Example 9

The alternating-current power-switching device of example 6, wherein the fuse is configured as a resettable fuse.

Example 10

The alternating-current power-switching device of example 1, wherein the rectifier is configured to output a direct current voltage in a range of 21 volts to 27 volts.

Example 11

The alternating-current power-switching device of example 1, wherein the rectifier is configured as a half-wave rectifier.

Example 12

The alternating-current power-switching device of example 1, wherein the rectifier is configured as a full-wave rectifier.

Example 13

The alternating-current power-switching device of example 1, wherein the rectifier is configured as a bridge rectifier.

Example 14

The alternating-current power-switching device of example 1, wherein the voltage regulator is configured to output a direct current voltage in a range of 1.5 volts to 2.1 volts.

Example 15

The alternating-current power-switching device of example 1, wherein the voltage regulator is configured to supply direct current voltage to the bypass switch and the controller.

Example 16

The alternating-current power-switching device of example 1, wherein the controller comprises a light-emitting diode configured to provide an input to the bypass switch.

Example 17

The alternating-current power-switching device of example 16, wherein the controller drives the light-emitting diode with a logic-level output.

Example 18

The alternating-current power-switching device of example 16, wherein the controller drives the light-emitting diode with an open-drain output.

Example 19

The alternating-current power-switching device of example 1, wherein the controller is further configured to, in response to activating the bypass switch, set a second lockout timer defining a second duration of time shorter than the first duration of time, the second lockout timer usable by the controller to prohibit deactivation of the bypass switch until the second duration of time has expired.

Example 20

A system comprising: a video-recording doorbell; a doorbell chime electrically connected to the video-recording doorbell and configured to generate an audio signal in response to activation of a button on the video-recording doorbell; a transformer connected to the doorbell chime and the video-recording doorbell, the transformer configured to provide power to the video-recording doorbell; and the alternating-current power-switching device of any one of examples 1 to 19, the alternating-current power-switching device connected to the video-recording doorbell and the doorbell chime, the alternating-current power-switching device configured to control power provided to the chime.

Example 21

The system of example 20, wherein the bypass switch directs power to the video doorbell or to the doorbell chime.

CONCLUSION

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying Drawings and terms discussed herein may be indicative of one or more items or terms, and thus reference may be made interchangeably to single or plural forms of the items and terms in this written description.

Although aspects of an alternating-current power-switching device have been described in language specific to features and/or methods, the subject of the appended claims is not necessarily limited to the specific features or methods described. Rather, the specific features and methods are disclosed as example implementations of the techniques for an alternating-current power-switching device, and other equivalent features and methods are intended to be within the scope of the appended claims. Further, various aspects are described, and it is to be appreciated that each described aspect can be implemented independently or in connection with one or more other described aspects.

What is claimed is:

1. An alternating-current power-switching device comprising:
    first and second current input/output nodes;
    a current-limiting resistor connected in series with the second current input/output node;
    a bypass switch connected in series between the current-limiting resistor and the first current input/output node, the bypass switch comprising a first light-emitting-diode-input normally-closed solid-state relay and a second light-emitting-diode-input normally-closed solid-state relay connected in parallel with the first light-emitting-diode-input normally-closed solid-state relay;
    a rectifier connected in parallel with the bypass switch and the current-limiting resistor;
    a voltage regulator connected to an output of the rectifier; and
    a controller connected to the output of the rectifier and an output of the voltage regulator, the controller comprising a programmable controller chip, the controller configured to:
        detect a voltage level at the output of the rectifier;
        in response to the voltage level exceeding a first voltage level threshold, open the bypass switch;
        in response to opening the bypass switch, set a first lockout timer defining a first duration of time, the first lockout timer usable by the controller to close the bypass switch if the voltage level exceeds the first voltage level threshold for longer than the first duration of time defined by the first lockout timer; and
        close the bypass switch in response to the voltage level dropping below a second voltage level threshold prior to expiration of the first lockout timer, the second voltage level threshold being lower than the first voltage level threshold.

2. The alternating-current power-switching device of claim 1, wherein the current-limiting resistor comprises a first current-limiting resistor connected in parallel with a second current-limiting resistor.

3. The alternating-current power-switching device of claim 1, wherein the current-limiting resistor comprises a first current-limiting resistor connected in series with a second current-limiting resistor.

4. The alternating-current power-switching device of claim 1, further comprising a fuse connected in series between the first current input/output node and a node shared by the bypass switch and the rectifier.

5. The alternating-current power-switching device of claim 4, wherein the fuse is configured as one of a positive-temperature-coefficient fuse, a thermal fuse, or a resettable fuse.

6. The alternating-current power-switching device of claim 1, wherein the first and second current input/output nodes have a voltage in a range of 20 volts to 43 volts.

7. The alternating-current power-switching device of claim 1, wherein the rectifier is configured as one of a half-wave rectifier, a full-wave rectifier, or a bridge rectifier.

8. The alternating-current power-switching device of claim 7, wherein the rectifier is configured to output a direct current voltage in a range of 21 volts to 27 volts.

9. The alternating-current power-switching device of claim 1, wherein the voltage regulator is configured to supply direct current voltage to the bypass switch and the controller.

10. The alternating-current power-switching device of claim 9, wherein the voltage regulator is configured to output a direct current voltage in a range of 1.5 volts to 2.1 volts.

11. The alternating-current power-switching device of claim 1, wherein the controller comprises a light-emitting diode configured to provide an input to the bypass switch.

12. The alternating-current power-switching device of claim 11, wherein the controller drives the light-emitting diode with a logic-level output or an open-drain output.

13. The alternating-current power-switching device of claim 1, wherein the controller is further configured to, in response to opening the bypass switch, set a second lockout timer defining a second duration of time shorter than the first duration of time, the second lockout timer usable by the controller to prohibit closure of the bypass switch until the second duration of time has expired.

14. A system comprising:
a video-recording doorbell;
a doorbell chime electrically connected to the video-recording doorbell and configured to generate an audio signal in response to activation of a button on the video-recording doorbell;
a transformer connected to the doorbell chime and the video-recording doorbell, the transformer configured to provide power to the video-recording doorbell; and
an alternating-current power-switching device of, the alternating-current power-switching device connected to the video-recording doorbell and the doorbell chime, the alternating-current power-switching device configured to control power provided to the chime, the alternating-current power-switching device comprising:
first and second current input/output nodes;
a current-limiting resistor connected in series with the second current input/output node;
a bypass switch connected in series between the current-limiting resistor and the first current input/output node, the bypass switch comprising a first light-emitting-diode-input normally-closed solid-state relay and a second light-emitting-diode-input normally-closed solid-state relay connected in parallel with the first light-emitting-diode-input normally-closed solid-state relay;

a rectifier connected in parallel with the bypass switch and the current-limiting resistor;
a voltage regulator connected to an output of the rectifier; and
a controller connected to the output of the rectifier and an output of the voltage regulator, the controller comprising a programmable controller chip, the controller configured to:
detect a voltage level at the output of the rectifier;
in response to the voltage level exceeding a first voltage level threshold, open the bypass switch;
in response to opening the bypass switch, set a first lockout timer defining a first duration of time, the first lockout timer usable by the controller to close the bypass switch if the voltage level exceeds the first voltage level threshold for longer than the first duration of time defined by the first lockout timer; and
close the bypass switch in response to the voltage level dropping below a second voltage level threshold prior to expiration of the first lockout timer, the second voltage level threshold being lower than the first voltage level threshold.

15. The system of claim 14, wherein:
the alternating-current power-switching device further comprises a fuse connected in series between the first current input/output node and a node shared by the bypass switch and the rectifier; and
the fuse is configured as one of a positive-temperature-coefficient fuse, a thermal fuse, or a resettable fuse.

16. The system of claim 14, wherein the first and second current input/output nodes of the alternating-current power-switching device have a voltage in a range of 20 volts to 43 volts.

17. The system of claim 14, wherein:
the rectifier of the alternating-current power-switching device is configured as one of a half-wave rectifier, a full-wave rectifier, or a bridge rectifier; and
the rectifier is configured to output a direct current voltage in a range of 21 volts to 27 volts.

18. The system of claim 14, wherein:
the voltage regulator of the alternating-current power-switching device is configured to supply direct current voltage to the bypass switch and the controller; and
the voltage regulator is configured to output a direct current voltage in a range of 1.5 volts to 2.1 volts.

19. The system of claim 14, wherein:
the controller of the alternating-current power-switching device comprises a light-emitting diode configured to provide an input to the bypass switch; and
the controller is configured to drive the light-emitting diode with a logic-level output or an open-drain output.

20. The system of claim 14, wherein the controller of the alternating-current power-switching device is further configured to, in response to opening the bypass switch, set a second lockout timer defining a second duration of time shorter than the first duration of time, the second lockout timer usable by the controller to prohibit closure of the bypass switch until the second duration of time has expired.

* * * * *